United States Patent
Bogner et al.

(10) Patent No.: US 7,312,927 B2
(45) Date of Patent: Dec. 25, 2007

(54) HEAD-UP DISPLAY

(75) Inventors: Georg Bogner, Hainsacker (DE); Herbert Breinich, Hochheim (DE); Bernd Ludewig, Hirschberg (DE); Ralf Mayer, Bolanden (DE); Heinrich Noll, Groβ-Umstadt (DE); Jörg-Erich Sorg, Regensburg (DE)

(73) Assignees: Siemens Aktiengesellschaft, Müchen (DE); Osram Opto Semiconductors GmbH, Regensburg (DE)

( * ) Notice: Subject to any disclaimer, the term of this patent is extended or adjusted under 35 U.S.C. 154(b) by 260 days.

(21) Appl. No.: 10/529,706

(22) PCT Filed: Sep. 1, 2003

(86) PCT No.: PCT/DE03/02891

§ 371 (c)(1),
(2), (4) Date: Mar. 29, 2005

(87) PCT Pub. No.: WO2004/032235

PCT Pub. Date: Apr. 15, 2004

(65) Prior Publication Data

US 2006/0007553 A1    Jan. 12, 2006

(30) Foreign Application Priority Data

Sep. 30, 2002    (DE)    ................ 102 45 933

(51) Int. Cl.
*G02B 27/14*    (2006.01)
*G02B 27/10*    (2006.01)
*G02B 5/02*    (2006.01)
*G01D 11/28*    (2006.01)
*F21V 5/00*    (2006.01)

(52) U.S. Cl. ............... 359/630; 359/619; 359/245; 359/247; 359/253; 359/599; 362/27; 362/30; 362/19; 362/44; 362/245; 362/231; 362/252; 362/293; 362/331; 362/561

(58) Field of Classification Search ............... 359/619, 359/630, 245–247, 230, 252, 253, 295, 599; 362/31, 32, 27, 44, 97, 231, 251, 252, 292, 362/293, 302, 309, 339, 467, 494, 503, 19, 362/30, 245, 331, 555, 559, 560, 561, 607, 362/613, 620; 257/E25.02, E33.072; 349/10, 349/60, 65, 112; 385/36, 43, 133, 146; 250/208.1, 250/484.4
See application file for complete search history.

(56) References Cited

U.S. PATENT DOCUMENTS 4,935,665 A    6/1990    Murata (Continued)

FOREIGN PATENT DOCUMENTS

| JP | 7130256 | 5/1995 |
| WO | WO 00/70687 | 11/2000 |
| WO | WO 02/05351 A1 | 1/2002 |

OTHER PUBLICATIONS

International Search Report for International Application No. PCT/DE03/02891, on which the present invention is based.

*Primary Examiner*—Loha Ben
(74) *Attorney, Agent, or Firm*—Cohen Pontani Lieberman & Pavane LLP

(57) ABSTRACT

A straw holder for supporting a drinking straw in the mouth of a bottle is presented. The holder includes a straw support portion dimensioned for placement across the mouth of a bottle. The straw support portion includes an aperture designed to receive a straw therethrough and to vertically support the straw with respect to the support portion. The holder further includes a bottle retaining portion that includes at least one turn extending around the retaining portion. The at least one turn includes a first turn having an end attached to the straw support portion.

5 Claims, 3 Drawing Sheets

U.S. PATENT DOCUMENTS

| | | |
|---|---|---|
| 5,043,716 A | 8/1991 | Latz et al. |
| 5,617,131 A | 4/1997 | Murano et al. |
| 5,836,676 A | 11/1998 | Ando et al. |
| 5,963,280 A * | 10/1999 | Okuda et al. .................. 349/65 |
| 6,871,982 B2 * | 3/2005 | Holman et al. ............. 362/331 |
| 6,964,489 B2 * | 11/2005 | Blume et al. .................. 362/27 |
| 7,072,096 B2 * | 7/2006 | Holman et al. ............. 359/298 |
| 7,146,084 B2 * | 12/2006 | Atac et al. ................... 385/115 |
| 2006/0232969 A1 * | 10/2006 | Bogner et al. ............... 362/252 |

* cited by examiner

HEAD-UP DISPLAY

CROSS-REFERENCE TO RELATED APPLICATIONS

This is a U.S. national stage of application No. PCT/DE03/02891, filed on 1 Sep. 2003. Priority is claimed on the following application(s): Country: Germany, Application No.: 102 45 933.9, Filed: 30 Sep. 2002 the content of which is/are incorporated herein by reference.

BACKGROUND OF THE INVENTION

1. Field of the Invention

The invention relates to a head up display with a device for producing a focused light flux, having a light source and having an image reproduction apparatus including light valves.

2. Description of the Prior Art

In order to convey information to vehicle drivers without the need for them to avert their gaze from the road to be driven or the air space to be flown, so-called head up displays have become known that are used to fade in an image representing information into the windshield of a vehicle. In order for the image still to remain visible in bright ambient light, there is an additional need for it to have a high luminous density. Focused light fluxes are also required for other illumination purposes, for example as reading lamps or as emitters for show-windows and expositions.

Devices for producing a focused light flux have already been disclosed in U.S. Pat. Nos. 5,836,676, 5,043,716 and 5,617,131 in an application for a display, in each case. A luminaire with focusing of the light beam is known from U.S. Pat. No. 4,935,665. However, the arrangements shown exhibit scarcely any suitability for use in a head-up display, because of their respective focusing and scattering characteristics.

SUMMARY OF THE INVENTION

It is therefore an object of the invention to produce a light flux with the aid of devices that exhibit, in particular, a low overall size and low weight, consume, and/or output as heat, as little power loss as possible, and are therefore also suitable for operation in a vehicle.

This object is achieved according to the invention by a head up display including a device for producing a focused light flux, the display comprising a light source having a plurality of light emitting diodes arranged in points of a light emitting diode matrix, an optical device arranged and dimensioned for focusing and scattering light produced by the light source, the optical device including a grid reflector comprising walls reflecting the light produced by the light source and forming light channels for each point of the light emitting diode matrix, the light channels each having a first end facing the light source and a second end at a light exit opening of the optical device, and a positive lens arranged at the first end of each of the light channels, an image reproduction apparatus including light valves arranged proximate the light exit opening of the optical device, and a diffusing screen arranged between the image reproduction apparatus and the light exit opening.

According to the invention, a matrix point is formed in each ease from a number of light-emitting diodes, which can also be of different color. Furthermore, the invention is not restricted to the application of in each ease a single lens per light channel.

A cost effective fabrication of the device according to the invention is possible when the positive lenses of all the light channels are integrally connected to a plate arranged between the light source and the grid reflector. However, this plate permits an undesired conduction of light in a transverse direction, and this can be prevented when the positive lenses are integrally connected in groups to webs arranged between the light source and the grid reflector.

An advantageous refinement of the invention consists in that the radii of curvature of the lens differ in different directions (astigmatic lenses). The light distribution can thereby be improved, particularly in elongated light exit openings.

The image reproduction apparatus including light valves and arranged at the light exit opening permits a compact device for producing high-resolution images of high luminous density and with a uniform distribution of luminous density over the entire image area. The device for focusing and scattering ensures in this case that the light produced by the light-emitting diodes is concentrated onto the surface of the image reproduction apparatus without the individual light emitting diodes being disturbingly imaged. A preferred field of application of the device according to the invention are graphical head up displays for vehicle applications.

The image reproduction apparatus lends the device according to the invention a few more advantages, which are set forth below. Thus, the coordination between RGB light source and color display renders possible the display of graphic color images in a head up display in conjunction with adequate luminous density. A uniform distribution of color and luminous density of the background lighting on the area of the liquid crystal display is achieved in cooperation with the reflector and the lens.

Configurable image contents can be displayed in color in the liquid crystal color display. The image content can therefore be adapted to the driving situation. The installation space for the entire image generating device is only a few cubic centimeters in the case of the example executed in practice. It is possible to influence the color space respectively to be displayed by selecting the colors of the light emitting diodes and of the associated display. For example, instead of an RGB light emitting diode matrix it is possible to select a red/green light emitting diode matrix and, in a corresponding way, to replace the blue filter elements by green ones in the liquid crystal display. This results in a restricted color space with a luminous density that has been further substantially increased.

BRIEF DESCRIPTION OF THE DRAWINGS

The invention permits numerous embodiments. A number of them are illustrated schematically in the drawing with the aid of a number of figures, and described below. In the drawings.

DETAILED DESCRIPTION OF THE PREFERRED EMBODIMENTS

Figure 1:
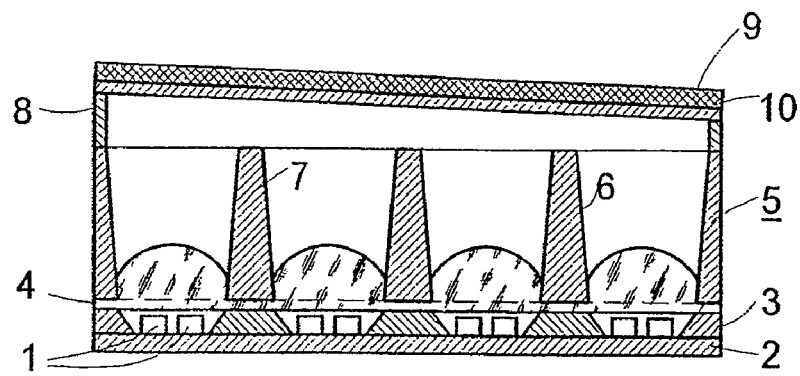
FIG. 1 is a cross-sectional view through a device comprising an embodiment of the present invention.
Figure 2:
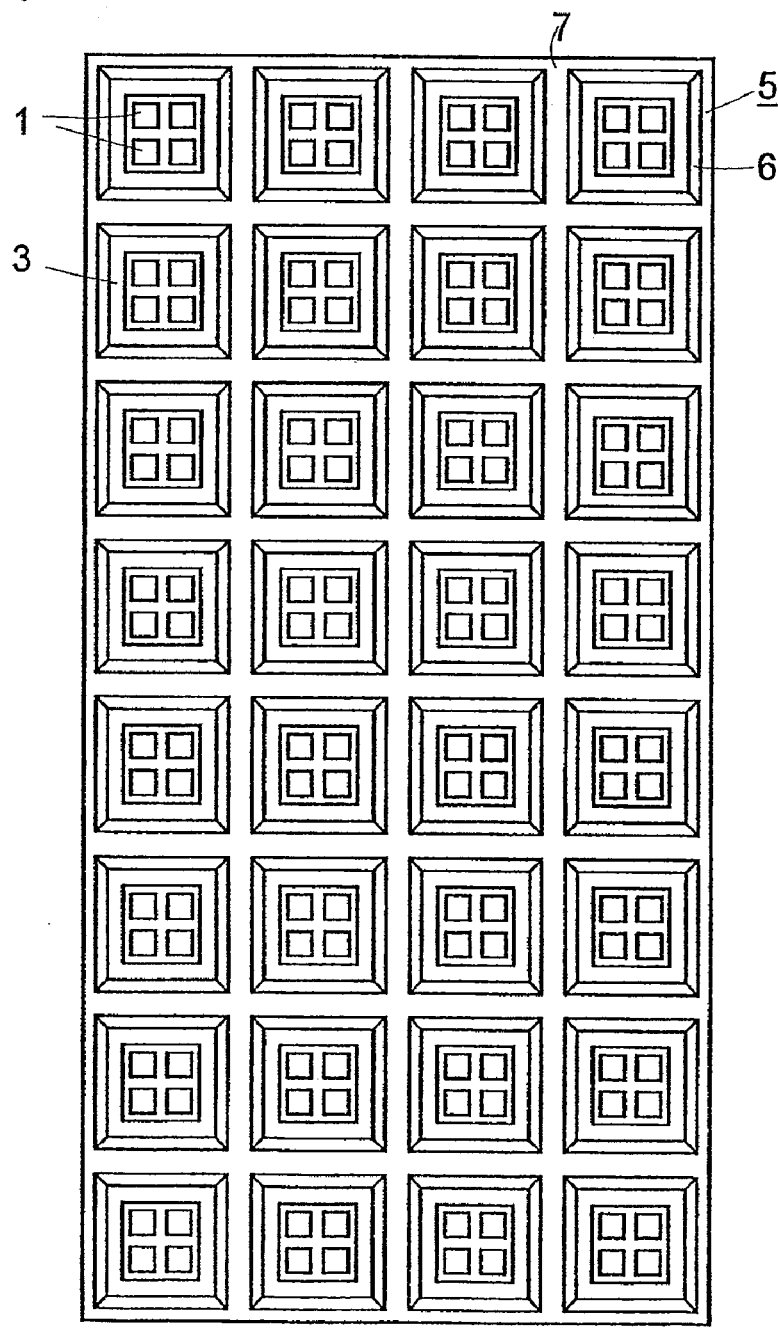
FIG. 2 is a plan view of the grid reflector for the embodiment according to FIG. 1.

Provided as light source in the exemplary embodiment according to FIGS. 1 and 2 is a matrix of 4×8 groups of in each case four light emitting diodes 1 that are mounted on a support 2. Webs 3 whose oblique surface serves as reflector are located between the groups.

A lens array 4 adjoined by a grid reflector 5 lies over the light source 1, 2, 3.

The webs 3, the lens matrix 4 and the obliquely running surfaces 6 of the grid reflector 5 effect uniform light distribution. In order to avoid shading by the webs 7 of the reflector 5, a frame 8 is provided that effects a spacing between the reflector 5 and the liquid crystal display 9. Located below the liquid crystal display 9 is a diffusing screen 10 which serves the purpose of further improving the uniformity of the backlighting of the liquid crystal display 9.

The frame 8 positions the liquid crystal display obliquely such that the light incident from above is not reflected in the same direction in which the light also leaves the liquid crystal display in order to reach the viewer.

FIG. 2 shows the device according to FIG. 1 with the liquid crystal display 9 removed and with the diffusing screen 10 removed. The light emitting diodes 1 are visible per se through the lens matrix 4 in the case of the illustration according to FIG. 2.

However, for the sake of simplicity a corresponding distortion of the light emitting diodes 1 has not been illustrated.

Figure 3:
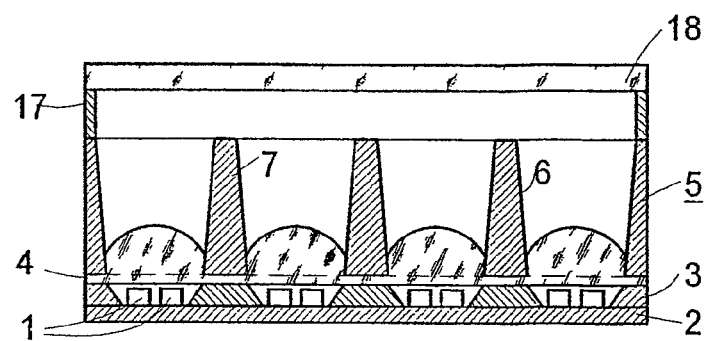
FIG. 3 is a cross-sectional view a section through a further embodiment according to the invention.

The exemplary embodiment according to FIG. 3 illustrates an illuminating device where the light exit opening comprises a glass plate 18 resting on a frame 17. Otherwise, this exemplary embodiment is constructed like that according to FIG. 1.

Figure 4:
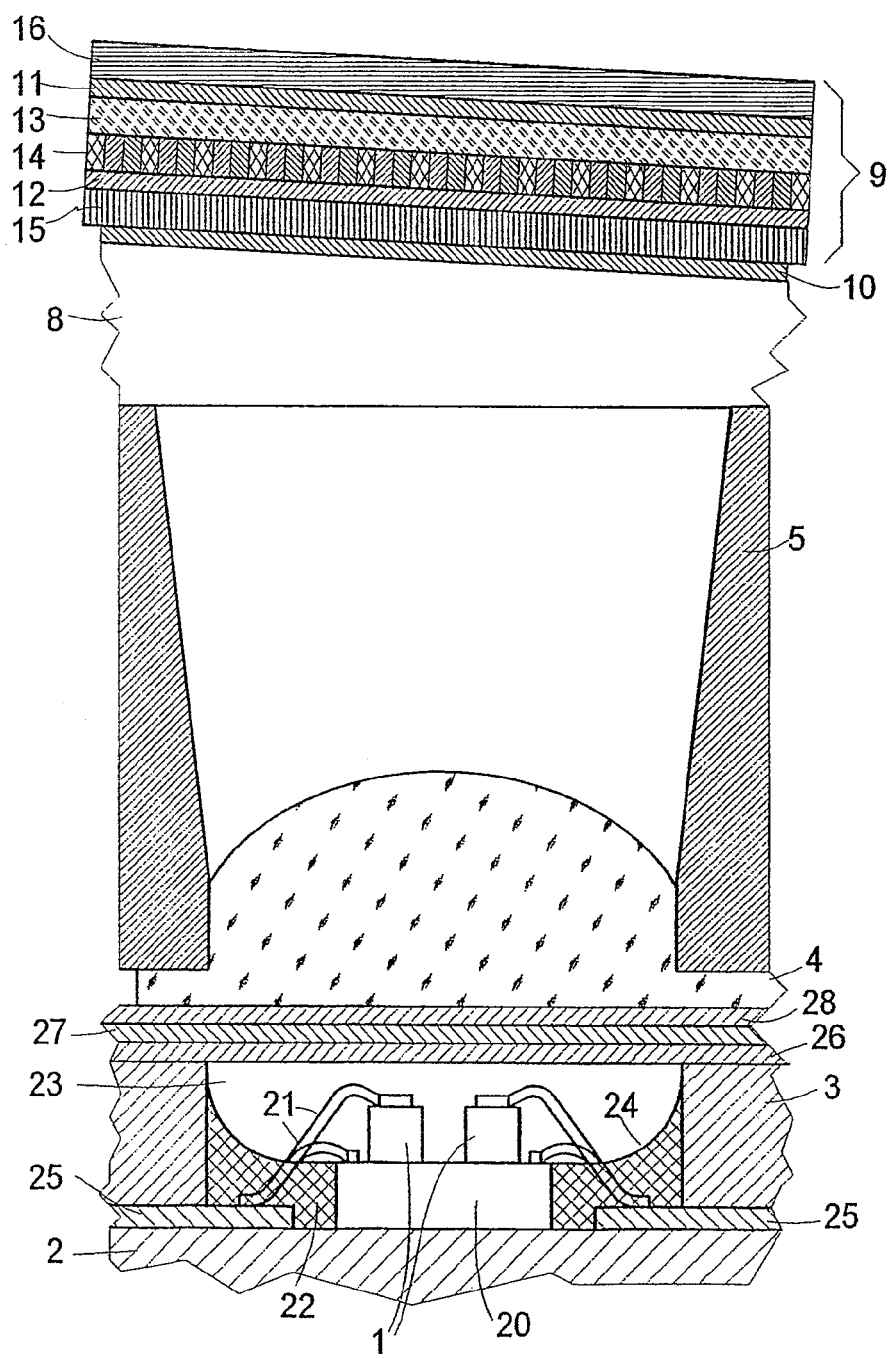
FIG. 4 is an enlarged illustration showing details of the device from FIG. 1.

FIG. 4 essentially illustrates an enlarged detail from FIG. 1, and serves to explain details of the liquid crystal display and of the light source. The liquid crystal display 9 has a liquid crystal 13 and a color filter 14 between two glass plates 11, 12. Said color filter consists of an array of three differently colored color points, which is marked in FIG. 4 by different hatching. Control electrodes (not illustrated) are provided in a fashion correlating with the array of the color filter, and form a light valve in each case with the liquid crystal. Located outside the glass plates 11, 12 are polarizers 15, 16 with mutually perpendicular polarization planes.

The light source briefly described in conjunction with FIG. 1 is illustrated in FIG. 4, likewise in more detail.

Four light emitting diodes 1 are arranged on a submount 20 in a fashion raised in the middle of a hole formed by webs 3. The light emitting diodes are connected to lines 25 via bonding wires 21 that are illustrated only schematically by hatching the area they occupy. In a preferred embodiment, one of the light emitting diodes shines red, two shine green, and the fourth shines blue. In this arrangement, light is mixed to form white. The space between the submount 20 and the webs 3 is filled up with a white potting compound 22 whose surface 24 serves as reflector for the light emitted laterally from the light emitting diodes 1.

A transparent potting compound 23 prevents the formation of a cavity.

In the case of the exemplary embodiment illustrated in FIG. 4, the connection between the light source 1, 2 3 and the lens matrix 4 is performed via a layer 26 made from silicone gel, a PCF layer 27 and a suitable adhesive 28.

The PCF layer 27 has the effect that from the light which is produced by means of the light emitting diodes, only that is allowed through which is polarized in the direction of the lower polarizer 15, so that no light is lost by the polarization in the PCF layer 27. The differently polarized light is reflected by the PCF layer 27 and subsequently re-emitted from the surface 24. Of this, the component with the appropriate polarization in turn additionally passes through the PCF layer 27 such that, overall, the PCF layer contributes to increasing the brightness.

Figure 5:
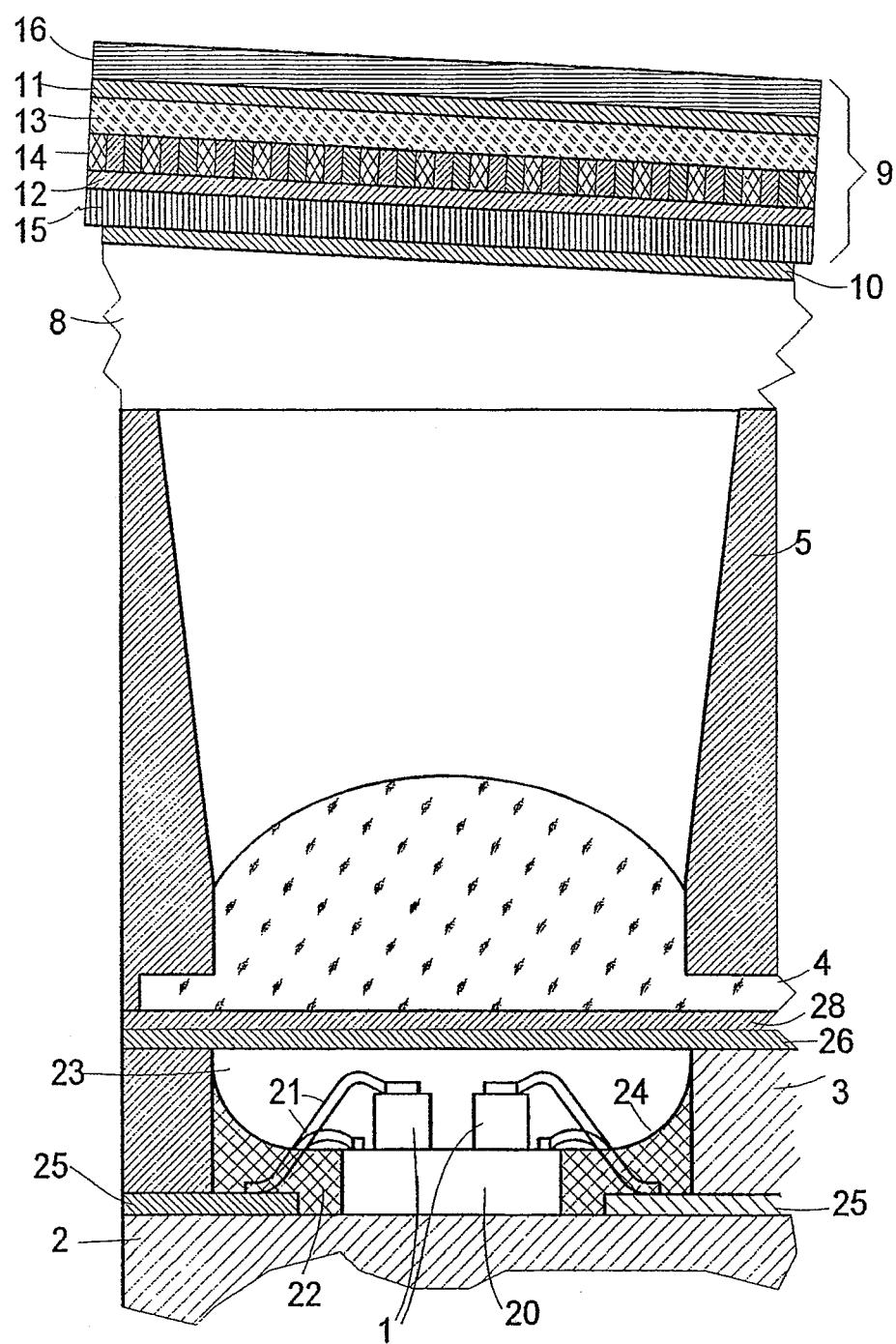
FIG. 5 is an enlarged cross-sectional illustration showing a device according to another embodiment of the present invention.

FIG. 5 shows an exemplary embodiment without a PCF layer. The illustrated detail at the edge of the device is also to be found in FIG. 5.

Figure 6:
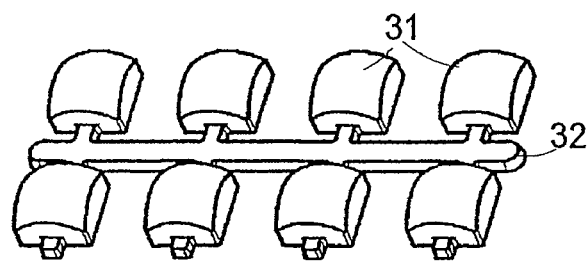
FIG. 6 shows is a perspective view showing a part of the lens matrix according to the invention.

FIG. 6 shows a lens matrix 31 with eight lenses that are held together by webs 32. Four of the lens matrices illustrated in FIG. 6 are arranged next to one another in the exemplary embodiment according to FIGS. 4 and 5.

What is claimed is:

1. A head up display having a device for producing a focused light flux, said display comprising:
    a light source having a plurality of light emitting diodes arranged in points of a light emitting diode matrix;
    an optical device arranged and dimensioned for focusing and scattering light produced by said light source, the optical device including a grid reflector comprising walls reflecting the light produced by said light source and forming light channels for each point of said light emitting diode matrix, said light channels each having a first end facing said light source and a second end at a light exit opening of said optical device, and a positive lens arranged at the first end of each of said light channels;
    an image reproduction apparatus including light valves arranged proximate the light exit opening of said optical device; and
    a diffusing screen arranged between the image reproduction apparatus and the light exit opening.

2. The head up display of claim 1, further comprising a plate arranged between said light source and second grid reflector, said positive lenses of said optical device being integrally connected with said plate.

3. The head up display of claim 1, further comprising a plurality of webs arranged between said light source and said grid reflector, said positive lenses being arranged in groups, each of said groups of positive lenses being integrally connected with one of said plural webs.

4. The head up display of claim 1, wherein each of said positive lenses comprises an astigmatic lens having different radii of curvature in different directions.

5. The head up display of claim 1, wherein said image reproduction apparatus is arranged obliquely such that incident light is reflected in a direction that is different than the direction in which the light from said light source leaves the image reproduction apparatus.

* * * * *

UNITED STATES PATENT AND TRADEMARK OFFICE
CERTIFICATE OF CORRECTION

| | | |
|---|---|---|
| PATENT NO. | : 7,312,927 B2 | |
| APPLICATION NO. | : 10/529706 | |
| DATED | : December 25, 2007 | |
| INVENTOR(S) | : Georg Bogner et al. | |

It is certified that error appears in the above-identified patent and that said Letters Patent is hereby corrected as shown below:

On the Title Pg.
Please replace the Abstract with the following:

Item (57) ABSTRACT

The invention relates to a device for producing a bundled light flux. According to the invention, a light source consisting of a light emitting diode matrix is provided, an optical device for bundling and scattering the light produced by the light-emitting diodes is arranged between the light source and a light outlet the device for bundling and scattering comprises a latticed reflector which respectively forms a light channel for each matrix point, the walls of said light channel being reflective, and the end of each light channel, facing the light source the contains a convergent lens.

Signed and Sealed this
Eighth Day of March, 2011

David J. Kappos
*Director of the United States Patent and Trademark Office*